(12) United States Patent
Chen et al.

(10) Patent No.: US 7,061,347 B2
(45) Date of Patent: Jun. 13, 2006

(54) HIGH FREQUENCY SUBSTRATE COMPRISED OF DIELECTRIC LAYERS OF DIFFERENT DIELECTRIC COEFFICIENTS

(75) Inventors: Kun-Ching Chen, Tainan (TW); Sung-Mao Wu, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 10/749,917

(22) Filed: Dec. 31, 2003

(65) Prior Publication Data
US 2004/0155733 A1    Aug. 12, 2004

(30) Foreign Application Priority Data
Dec. 31, 2002    (TW) .............................. 91138177 A

(51) Int. Cl.
*H01P 3/08*    (2006.01)
(52) U.S. Cl. ...................... 333/238; 333/246
(58) Field of Classification Search ............... 333/238, 333/246
See application file for complete search history.

(56) References Cited

U.S. PATENT DOCUMENTS

| | | | |
|---|---|---|---|
| 3,906,387 A * | 9/1975 | Martel et al. ................ | 330/286 |
| 5,212,463 A * | 5/1993 | Babbitt et al. .............. | 333/161 |
| 5,652,557 A * | 7/1997 | Ishikawa .................... | 333/243 |
| 5,753,968 A * | 5/1998 | Bahl et al. .................. | 257/664 |
| 6,263,220 B1 * | 7/2001 | Mansour .................... | 505/210 |
| 6,360,112 B1 * | 3/2002 | Mizuno et al. ............. | 505/210 |

* cited by examiner

*Primary Examiner*—Benny Lee
(74) *Attorney, Agent, or Firm*—Thomas, Kayden, Horstemeyer & Risley

(57) ABSTRACT

A high frequency substrate includes a first metal layer, a first dielectric layer, a second metal layer, a second dielectric layer and a high-frequency signal transmission line. The first dielectric layer is formed on the first metal layer, and the second metal layer is formed on the first dielectric layer. The first and second metal layers are maintained in a stable voltage status due to the high dielectric coefficient of the first dielectric layer. Besides, the second dielectric layer is formed on the second metal layer. High speed and high frequency transmission are achieved when signals transmitting in the high-frequency transmission line formed on the second dielectric layer due to the low dielectric coefficient of the second dielectric layer.

9 Claims, 3 Drawing Sheets

HIGH FREQUENCY SUBSTRATE COMPRISED OF DIELECTRIC LAYERS OF DIFFERENT DIELECTRIC COEFFICIENTS

This application claims the benefit of Taiwan application Serial No. 91138177, filed Dec. 31, 2002.

BACKGROUND OF THE INVENTION

1. Field of the Invention

The present invention relates to a high frequency substrate, and more specifically to a high frequency substrate capable of increasing the signal transmission speed of the high-frequency signal transmission line and maintaining the power plane and the ground plane in a stable voltage status.

2. Description of the Related Art

While wireless network and satellite communication are gaining rapid growth, electronic products tend to have the design of high speed, high frequency and high capacity. Consequently, the present electronic products need to have the support of a high frequency substrate in order that a high frequency and high speed performance can be achieved.

Please refer to FIG. 1, tbe cross-sectional view of a conventional high frequency substrate. In FIG. 1, the high frequency substrate 100 comprises a power plane 102, a ground plane 106, a high-frequency signal transmission line 110 and dielectric layers 104 and 108. The dielectric layer 104 is formed on the power plane 102; the ground plane 106 is formed on the dielectric layer 104. The dielectric layer 108 is formed on the ground plane 106 while the high-frequency signal transmission line 110 is deposited on the dielectije layer 108. The dielectric constant of the air outside the high-frequency signal transmission line 110 is 1 while the dielectric constant of the dielectric layers 104 and 108 is $\epsilon_{r}$, wherein the value of $\epsilon_r$ being greater than 1, say 4 for instance. Besides, the dielectric layers 104 and 108 are normally dense structures.

Suppose that the signal transmission speed in the high-frequency signal transmission line 110 is Vp, then Vp=C/$(\epsilon_{\mathit{eff}})^{1/2}$, wherein C is the speed of the light while $\epsilon_{\mathit{eff}}$ is the effective dielectric constant. That is to say, the signal transmission speed Vp is inversely proportional to the square root of the effective dielectric constant $\epsilon_{\mathit{eff}}$. It is noteworthy that $\epsilon_{\mathit{eff}}$ varies with the intensity of signal transmission frequency. In other words, an electromagnetic field will be generated during transmission. The dielectric constant for the medium of the high electromagnetic area can be regarded as $\epsilon_{\mathit{eff}}$.

Unlike in the case of low-frequency operation where the electromagnetic field generated during signal transmission concentrates in the air outside the high-frequency signal transmission line 110, the electromagnetic field generated during signal transmission almost entirely concentrates in the dielectric layer 108 because the high-frequency signal transmission line 110 normally has a high frequency of signal transmission. So the effective dielectric constant $\epsilon$eff approximatly equals to the dielectric constant $\epsilon_r$ of the dielectric layer 108. For instance, the value of $\epsilon_{\mathit{eff}}$ equals 4. Hence, the signal transmission speed Vp will slow down, which increases the energy loss of signals and in turn greatly affects signal transmission quality.

Moreover, the voltages of the power plane 102 and the ground plane 106 are interfered with one another due to the low diclectric constant of the dielectric layer 104; for example, $\epsilon_r$ is 4. The values of voltage in the power plane 102 and the ground plane 106 vary; the power plane 102 and the ground plane 106 are unable to be maintained in a stable voltage status so that the high frequency substrate 100 is subjected to huge impacts and unable to keep in well progress.

SUMMARY OF THE INVENTION

In view of the aforesaid difficulties of the conventional techniques, the present invention aims to provide a high frequency substrate with a high frequency transmission line formed on a low-dielectric-coefflcient dielectric layer, so tat high speed and high frequency transmission are thus achieved. Further more, the high frequency substrate of the invention has a high-dielectric-coefficient dielectric layer formed between the power plane and the ground plane, so that the voltage of the power plane and the ground plane are maintained stable with this particular design.

It is therefore an object of the present invention to provide an improved high frequency substrate having at least a first metal layer, a first dielectric layer, a second metal layer, a second dielectric layer and a high-frequency signal transmission line. The first dielectric layer is formed on the first metal layer, and the first dielectric layer is made of a high dielectric coefficient material. The second metal layer is formed on the first dielectric layer and the second dielectric layer is formed on the second metal layer; the second dielectric layer is made of a low dielectric coefficient material. The high-frequency signal transmission line is formed on the second dielectric layer.

It is another object of the present invention to provide an improved high frequency substrate at least having a first metal layer, a first dielectric layer, a second metal layer, a second dielectric layer, a third dielectric layer and a high-frequency signal transmission line. The first dielectric layer is formed on the first metal layer, and the first dielectric layer is made of a high dielectric coefficient material. The second metal layer is formed on the first dielectric layer and the second dielectric layer is formed on the second metal layer. The second metal layer has an opening; the third dielectric layer is filled within the opening and on the second metal layer. The third dielectric layer is made of a low dielectric coefficient material and the high-frequency signal transmission line is formed on the third dielectric layer.

It is a further object of the present invention to provide a substrate at least having a first dielectric layer, a second dielectric layer and a signal transmission line. The first dielectric layer has an opening and the second dielectric layer is filled within the opening; the signal transmission line is formed on the second dielectric layer. While the second dielectric layer is made of a low dielectric coefficient material, the signal transmission line thereon is a high-frequency signal transmission line. Relatively, while the second dielectric layer is made of a high dielectric coefficient material, the signal transmission line thereon is a low-frequency signal transmission line.

It is another further object of the present invention to provide a method of forming a substrate. The method includes the steps described as follow: first, a first dielectric layer is performed. Then, portions of the first dielectric layer are etched so that an opening is formed on the first dielectric layer. Further, a second dielectric layer is filled within the space; a signal transmission line is finally formed on the second dielectric layer. While the second dielectric layer is made of a low dielectric coefficient material, the signal transmission line thereon is a high-frequency signal transmission line. Relatively, while the second dielectric layer is made of a high dielectric coefficient material, the signal transmission line thereon is a low-frequency signal transmission line.

Other objects, features, and advantages of the invention will become apparent from the following detailed description of the preferred but non-limiting embodiments. The following description is made with reference to the accompanying drawings.

DETAILED DESCRIPTION OF THE INVENTION

The present invention provides a high frequency substrate with a high frequency transmission line on a low-dielectric-coefficient dielectric layer. Thus, high speed and high frequency transmission are achieved and also the disadvantages and limitations of existing high frequency substrate are overcome. Further more, the high frequency substrate of the invention has a high dielectric coefficient dielectric layer formed between the power plane and the ground plane. With this particular design, the voltage of the power plane and the ground plane are maintained stable. The implementation of the high frequency substrate is described as follows, taking three examples, with reference to the accompanying drawings.

EXAMPLE 1

Figure 2:
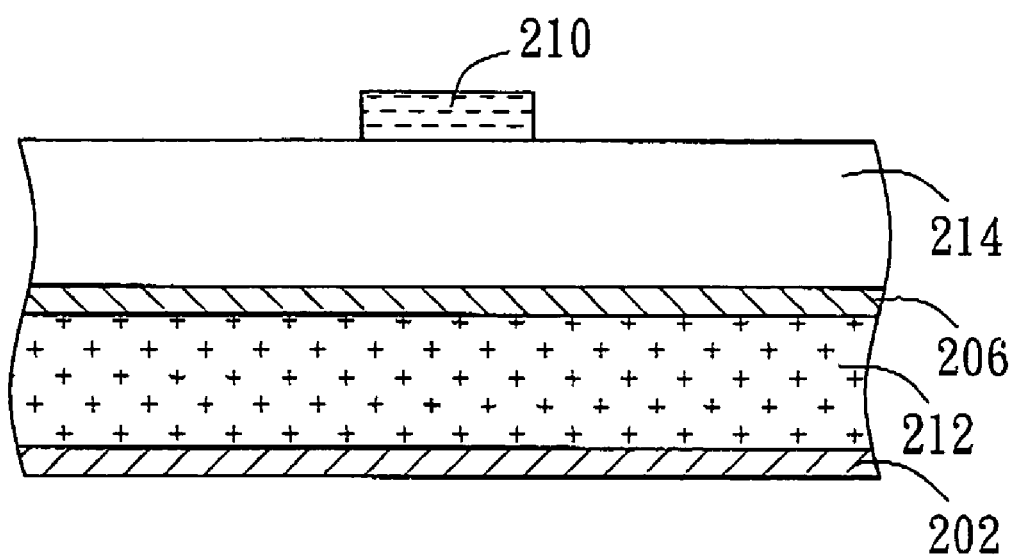
FIG. 2 is a cross-sectional view of a high frequency substrate in accordance with the first preferred embodiment of the invention.

FIG. 2 is a cross-sectional view of a high frequency substrate in accordance with the first preferred embodiment of the invention. Referring to FIG. 2, the high frequency substrate 200 has two metal layers 202 and 206, two dielectric layers 212 and 214 and a high-frequency signal transmission line 210. The dielectric layer 212 is formed on the metal layer 202 and the dielectric layer 212 is made of a high dielectric coefficient material; the value of the dielectric coefficient thereof is more than 4. The metal layer 206 is formed on the dielectric layer 212 and the dielectric layer 214 is formed on the metal layer 206. The dielectric layer 214 is made of a low dielectric coefficient material; the value of the dielectric coefficient thereof is less than 4. The high-frequency signal transmission line 210 is on the dielectric layer 214.

Figure 1:
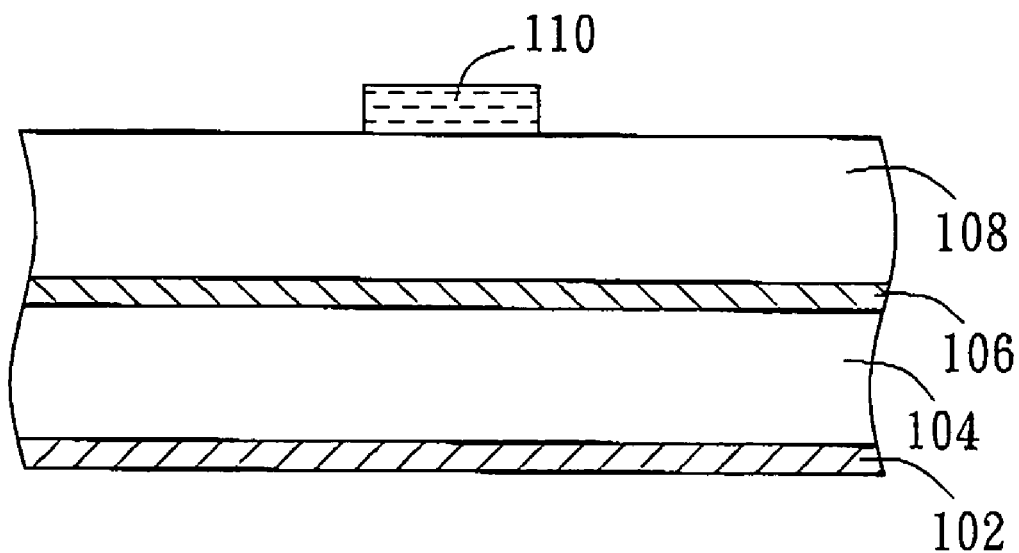
FIG. 1 (Prior Art) is a cross-sectional view of a conventional high frequency substrate.

The dielectric coefficient of the dielectric layer 214 is less than the dielectric coefficient of the traditional dielectric layer 108 shown in FIG. 1. It will be appreciated that the signal transmission speed in the high-frequency signal transmission line 210 will be enhanced in accordance with the relationship that the signal transmission speed is inversely proportional to the square root of the effective dielectric constant. The energy loss of the signal transmission is decreased so that high speed and high frequency transmission can be achieved.

Further, the dielectric coefficient of the dielectric layer 212 is greater than the dielectric coefficient of the traditional dielectric layer 104 shown in FIG. 1. It will be appreciated that the metal layers 202 and 206 (such as a power plane and a ground plane) can be maintained in a stable voltage status and the high frequency substrate 200 can be kept in well progress.

EXAMPLE 2

Figure 3:
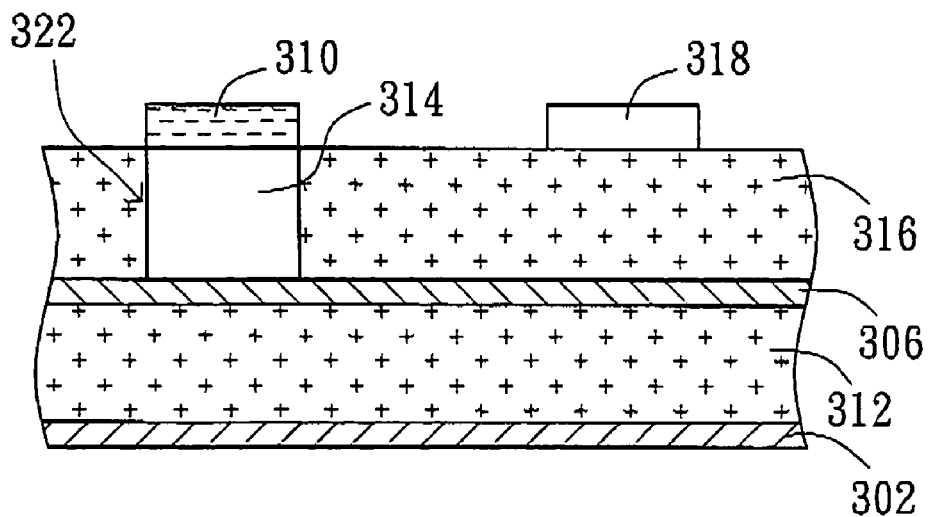
FIG. 3 is a cross-sectional view of a high frequency substrate in accordance with the second preferred embodiment of the invention.

FIG. 3 is a cross-sectional view of a high frequency substrate in accordance with the second preferred embodiment of the invention. Referring to FIG. 3, the high frequency substrate 300 has two metal layers 302 and 306, a high-frequency signal transmission line 310, a low-frequency signal transmission line 318 and three dielectric layers 312, 314 and 316. The dielectric layer 312 is on the metal layer 302 and the dielectric layer 312 is made of a high dielectric coefficient material; the value of the dielectric coefficient thereof is more than 4. The metal layer 306 is on the dielectric layer 312 and the dielectric layer 316 is formed on the metal layer 306. The dielectric layer 316 is possessed of an opening 322 so that portions of the metal layer 306 are exposed via the opening 322.

Further, the dielectric layers 312 and 316 are made of different materials and the dielectric coefficients thereof are different. The dielectric layer 314 is within the opening 322 and on the metal layer 306, so that the dielectric layer 314 and the dielectric layer 316 are both on the metal layer 306. The dielectric layer 314 is made of a low dielectric coefficient material; the value of the dielectric coefficient thereof is less than 4. The high-frequency signal transmission line 310 is on the dielectric layer 314 and a low-frequency signal transmission line 318 is relatively on the dielectric layer 316.

The dielectric coefficient of the dielectric layer 314 is less than the dielectric coefficient of the traditional dielectric layer 108 shown in FIG. 1. It will be appreciated that the signal transmission speed in the high-frequency signal transmission line 310 will be enhanced in accordance with the relationship that the signal transmission speed is inversely proportional to the square root of the effective dielectric constant. The energy loss of the signal transmission is decreased, so that high speed and high frequency transmission can be achieved.

Consideration should be given here to the dielectric layer 314. The top surface area of the dielectric layer 314 is equal to or larger than the bottom surface area of the high-frequency signal transmission line 310. The low-frequency signal transmission line 318 is disposed on the dielectric layer 316 so that the low-frequency signal transmission line 318 can be maintained in a stable voltage status.

Moreover, the dielectric coefficient of the dielectric layer 312 is greater than the dielectric coefficient of the traditional dielectric layer 104 shown in FIG. 1. It will be appreciated that the metal layers 302 and 306 (such as a power plane and a ground plane) can be maintained in a stable voltage status and the high frequency substrate 300 can be kept in well progress.

EXAMPLE 3

Figure 4:
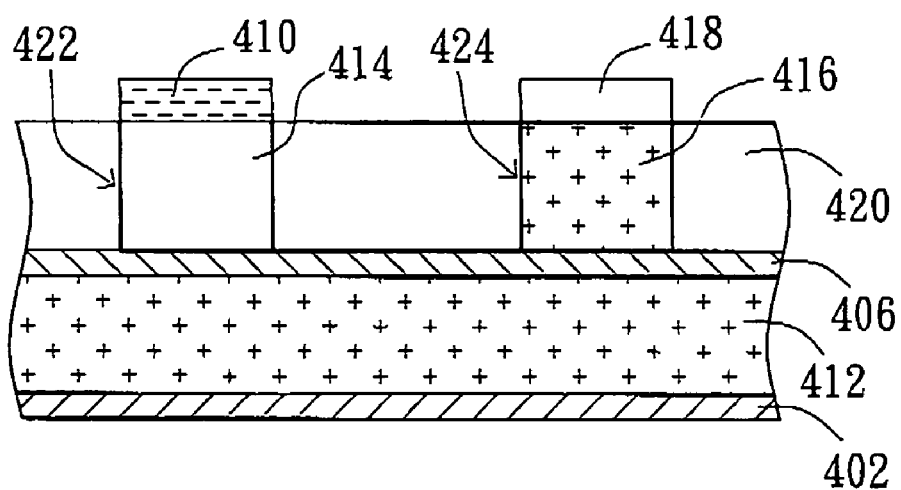
FIG. 4 is a cross-sectional view of a high frequency substrate in accordance with the third preferred embodiment of the invention.

FIG. 4 is a cross-sectional view of a high frequency substrate in accordance with the third preferred embodiment of the invention. Referring to FIG. 4, the high frequency substrate 400 has two metal layers 402 and 406, a high-frequency signal transmission line 410, a low-frequency signal transmission line 418 and four dielectric layers 412, 414, 416 and 420. The dielectric layer 412 is on the metal layer 402 and the dielectric layer 412 is made of a high dielectric coefficient material; the value of the dielectric coefficient thereof is more than 4. The metal layer 406 is formed on the dielectric layer 412 and the dielectric layer 420 is formed on the metal layer 406. The dielectric layer 420 is possessed of openings 422 and 424, so that portions of the metal layer 406 are exposed via the openings 422 and 424. Further, the dielectric layers 414 and 416 are respectively filled within the opening 422 and within the opening 424 but are both on the metal layer 406, so that the dielectric layers 414,416 and 420 are all on the metal layer 406. The dielectric layer 414 is made of a low dielectric coefficient material; the value of the dielectric coefficient thereof is less than 4. The dielectric layers 412 and 416 are both made of same high dielectric coefficient materials. The high-frequency signal transmission line 410 is on the dielectric layer 414 and a low-frequency signal transmission line 418 is on the dielectric layer 416.

The dielectric coefficient of the dielectric layer 414 is less than the dielectric coefficient of the traditional dielectric layer 108 shown in FIG. 1. It will be appreciated that the signal transmission speed in the high-frequency signal transmission line 410 will be enhanced in accordance with the relationship that the signal transmission speed is inversely proportional to the square root of the effective dielectric constant. The energy loss of the signal transmission is decreased so that high speed and high frequency transmission can be achieved.

Consideration should be given here to the dielectric layer 414. The top surface area of the dielectric layer 414 is equal to or larger than the bottom surface area of the high-frequency signal transmission line 410. The low-frequency signal transmission line 418 is disposed on the dielectric layer 416 so that the low-frequency signal transmission line 418 can be maintained in a stable voltage status. Further, the dielectric coefficient of the dielectric layer 412 is more than the dielectric coefficient of the traditional dielectric layer 104 shown in FIG. 1. It will be appreciated that the metal layers 402 and 406 (such as a power plane and a ground plane) can be maintained in a stable voltage status and the high frequency substrate 400 can be kept in well progress.

Moreover, the high frequency substrates of foregoing preferred embodiment of the invention can be made by build-up or lamination. The following description will present the forming a high-frequency substrate by build-up, taking the high-frequency substrate 400 in the third preferred embodiments of the invention as an example.

Referring to FIG. 4, a metal layer 402 is first formed. A dielectric layer 412 with a high dielectric coefficient material is formed on the metal layer 402. Next, covering a metal layer 406 on the dielectric layer 412 and covering a dielectric layer 420 on the metal layer 406. Further, removing portions of the dielectric layer 420 by etching, mechanical drilling, laser drilling and the like, so that openings 422 and 424 are formed on the metal layer 406. Then, depositing a low dielectric coefficient material to fill the opening 422 and forming the dielectric layer 414 by spin coating or by printing. Depositing a high dielectric coefficient material to fill the opening 424 and forming the dielectric layer 416 by spin coating or by printing. Next, applying a high-frequency signal transmission line 410 and a low-frequency signal transmission line 418 on the dielectric layers 414 and 416 by patterning and electroplating respectively.

The above steps are not just limited in what are described above. For example, the two metal layers of three preferred embodiments of the invention, 202 and 206, 302 and 306, 402 and 406 can be a power plane and a ground plane, respectively. The low dielectric coefficient material is polytetrafluroethylene (PTFE). Also, the high dielectric coefficient material of which the value of the dielectric coefficient is more than 4 could be bismaleimide triazine (BT), FR-4 epoxy resin, or polyimide (PI).

In summary, this high-frequency substrate of the present invention at least offers the following advantages:

a. With the particular design that high-frequency substrate with a high-frequency transmission line on a low-dielectric-coefficient dielectric layer, high speed and high frequency transmission are achieved and also the disadvantages and limitations of existing high-frequency substrate are overcome.

b. The high-frequency substrate of the invention has a high dielectric coefficient dielectric layer formed between the power plane and the ground plane. With this particular design, the voltage of the power plane and the ground plane are maintained stable.

While the invention has been described by three preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A high frequency substrate, comprising at least:

a first metal layer;

a first dielectric layer on the first metal layer, wherein the first dielectric layer is made of a high dielectric coefficient material;

a second metal layer on the first dielectric layer;

a second dielectric layer on the second metal layer, wherein the second dielectric layer comprises a first opening;

a third dielectric layer within the first opening and on the second metal layer, wherein the third dielectric layer is made of a low dielectric coefficient material, and a dielectric coefficient of the third dielectric layer is smaller than a dielectric coefficient of the second dielectric layer; and a high-frequency signal transmission line on the third dielectric layer.

2. The high frequency substrate according to claim 1, wherein the value of the dielectric coefficient for the high dielectric coefficient material is more than 4.

3. The high frequency substrate according to claim 1, wherein the low dielectric coefficient material is polytetrafluoroethylene (PTFE).

4. The high frequency substrate according to claim 1, wherein the value of the dielectric coefficient for the low dielectric coefficient material is less than 4.

5. The high frequency substrate according to claim 1, wherein a top surface area of the third dielectric layer is equal to or larger than a bottom surface area of the high-frequency signal transmission line.

6. The high frequency substrate according to claim 1, wherein the second dielectric layer is made of a high dielectric coefficient material.

7. The high frequency substrate according to claim 6, wherein the high-frequency substrate further comprises a low-frequency signal transmission line on the second dielectric layer.

8. The high frequency substrate according to claim 1, wherein the first metal layer is a power plane and the second metal layer is a ground plane.

9. The high frequency substrate according to claim 1, wherein the first metal layer is a ground plane and the second metal layer is a power plane.

* * * * *